(12) United States Patent
Suzuki et al.

(10) Patent No.: US 6,174,598 B1
(45) Date of Patent: Jan. 16, 2001

(54) MAGNETIC RECORDING MEDIUM, NON-MAGNETIC ALLOY FILM AND SPUTTERING TARGET

(75) Inventors: Mikio Suzuki; Kazunori Onami; Hiroshi Kanazawa; Hiroshi Sakai, all of Chiba (JP)

(73) Assignee: Showa Denko Kabushiki Kaisha, Tokyo (JP)

( * ) Notice: Under 35 U.S.C. 154(b), the term of this patent shall be extended for 0 days.

(21) Appl. No.: 09/075,228

(22) Filed: May 11, 1998

Related U.S. Application Data
(60) Provisional application No. 60/069,646, filed on Dec. 9, 1997.

(30) Foreign Application Priority Data

Sep. 30, 1997 (JP) ..................................................... 9-267469
Nov. 10, 1997 (JP) ..................................................... 9-307658

(51) Int. Cl.⁷ ..................................................... G11B 5/66
(52) U.S. Cl. ..................... 428/332; 428/336; 428/694 T; 428/694 TS; 428/900; 420/441; 420/445; 420/450; 204/192.2; 204/298.12
(58) Field of Search ........................ 428/694 T, 694 TS, 428/900, 332, 336; 204/192.2, 298.12, 290.13; 420/441, 445, 450

(56) References Cited

U.S. PATENT DOCUMENTS

| | | | | |
|---|---|---|---|---|
| 5,302,434 | * | 4/1994 | Doerner | 428/65.6 |
| 5,900,324 | * | 5/1999 | Moroishi | 428/611 |
| 5,939,202 | * | 8/1999 | Atoke | 428/457 |

* cited by examiner

*Primary Examiner*—Leszek Kiliman
(74) *Attorney, Agent, or Firm*—Sughrue, Mion, Zinn Macpeak & Seas, PLLC

(57) ABSTRACT

A low noise magnetic recording medium having a high coercive force and adapted for use with a MR head. The magnetic recording medium comprises a non-magnetic substrate having thereon a first non-magnetic underlayer and a magnetic layer comprising a Co alloy provided on the non-magnetic underlayer. The non-magnetic underlayer comprises an alloy represented by the formula: $(Ni_{50}Al)_{100-x}M_x$, wherein M is one of Cr (X=1–40 at %), Mo (X=1–50 at %), W (X=1–60 at %), V (X=1–35 at %), Zr (X=1–25 at %), Nb (X=1–35 at %) and Pd (X=1–25 at %), and when M includes two or more of Cr, Mo, W, V, Zr, Nb and Pd, X is from 1 to 60 at %.

17 Claims, 8 Drawing Sheets

US 6,174,598 B1

MAGNETIC RECORDING MEDIUM, NON-MAGNETIC ALLOY FILM AND SPUTTERING TARGET

CROSS REFERENCE TO RELATED APPLICATIONS

This application is an application filed under 35 U.S.C. §111 (a) claiming benefit pursuant to 35 U.S.C. §119(e) (1) of the filing date of the Provisional Application No. 60/069,646 filed Dec. 9, 1997 pursuant to 35 U.S.C. §111(b).

FIELD OF THE INVENTION

The present invention relates to a magnetic recording medium such as a magnetic drum, a magnetic tape and a magnetic disc, and more particularly, to a magnetic recording medium having reduced medium noise.

BACKGROUND OF THE INVENTION

In recent years, the density of magnetic disc devices or the like has increased. To accommodate such higher densities, there is a need for a magnetic recording medium (hereinafter sometimes referred to as a "medium") suitable for a magnetic head (hereinafter referred to as a "MR head") using a high magnetic resistance effect that is capable of high reproduction sensitivity.

The MR head has low head noise as compared with conventional magnetoelectric induction type heads. Therefore, the reduction of medium noise has become very important for improving the S/N of the device as a whole.

In a magnetic recording disc for a hard disc device (HDD) commonly used at present, a non-magnetic underlayer (e.g., Cr, Cr alloy), a magnetic layer (e.g., CoCrTa, CoCrPtTa alloy) and a protective layer (e.g., carbon) are provided in sequence on a non-magnetic substrate. Also, a lubricating layer comprising a liquid lubricant is formed thereon.

In order to optimize the recording/reproducing properties of the above-described magnetic recording medium, JP-B-5-23564 (the term "JP-B" as used herein means an "examined Japanese patent publication") proposes a Cr underlayer having a thickness of from 50 to 200 Å in order to increase squareness.

Furthermore, JP-A-1-232522 (the term "JP-A" as used herein means an "unexamined published Japanese patent application") proposes to add one or more metals selected from Cu, Nb, Ti, V, Zr, Mo, Zn, W and Ta to the Cr underlayer in order to enhance the magnetic properties, and particularly coercive force.

Furthermore, EP 0,704,839A1 proposes to use an alloy having a B2 ordered structure (e.g., AlNi, AlCo, AlFe) as the underlayer to reduce the crystal size of the magnetic layer and thereby provide improved noise characteristics.

When the Cr underlayer is formed having a thickness of from 50 to 200 Å as proposed in JP-B-5-23564, the Cr crystal structure is not fully oriented toward the (200) plane. As a result, sufficiently high coercivity cannot be obtained and the medium is not suitable for a MR head.

In JP-A-1-232522, the thickness of the Cr underlayer is from 500 to 3,000 Å so that the Cr grains can be oriented toward the (200) plane. Consequently, the noise can be reduced. Furthermore, although Cr or a Cr alloy is used as the non-magnetic underlayer of the smoothened substrate, problems arise in that the anisotropy controlling effect of the disc by texturing or the like is lowered to cause a reduction in coercivity and in turn a decrease in the reproduction output.

When an Al alloy having a B2 ordered structure (e.g., AlNi, AlCo, AlFe, etc.) is used as an underlayer, as proposed in EP 0,704,839A1, the crystal size of the magnetic layer is reduced due to the Al—Ni alloy or Al—Co alloy and the noise is improved. However, it is difficult to increase coercivity using the Al—Ni alloy or to increase coercive squareness using Al—Co alloy. Accordingly, the reproduction output is small. Thus, a problem still remains in performing high density recording.

SUMMARY OF THE INVENTION

It is therefore an object of the present invention to provide a magnetic recording medium suitable for a MR head, having both reduced noise and high coercivity.

The present inventors studied the characteristics of the Al—Ni alloy by adding thereto various elements and as a result, discovered that by adding a predetermined amount of Cr, Mo, W, V, Zr, Nb or Pd, a low noise magnetic recording medium having high coercivity (Hc) can be obtained. The present invention has been achieved based on these findings.

That is, the present invention solves the above problems of the prior art by providing a magnetic recording medium comprising a non-magnetic substrate having thereon a first non-magnetic underlayer and a magnetic layer comprising a Co alloy provided on the non-magnetic underlayer, wherein said non-magnetic underlayer comprises an alloy represented by the formula: $(Ni_{50}Al)_{100-X}M_X$ (wherein M is one or more of Cr (X=1–40 at %), Mo (X=1–50 at %), W (X=1–60 at %), V (X=1–35 at %), Zr (X=1–25 at %), Nb (X=1–35 at %) and Pd (X=1–25 at %), and when M comprises two or more of Cr, Mo, W, V, Zr, Nb and Pd, X is from 1 to 60 at %. As used herein, "at %" means "atom %".

In a preferred embodiment, the magnetic recording medium further comprises a protective layer provided on the magnetic layer. Also, when M comprises two or more of Cr, Mo, W, V, Zr, Nb and Pd, X is preferably from 1 t 50 at %.

DESCRIPTION OF THE PREFERRED EMBODIMENTS

Figure 1:
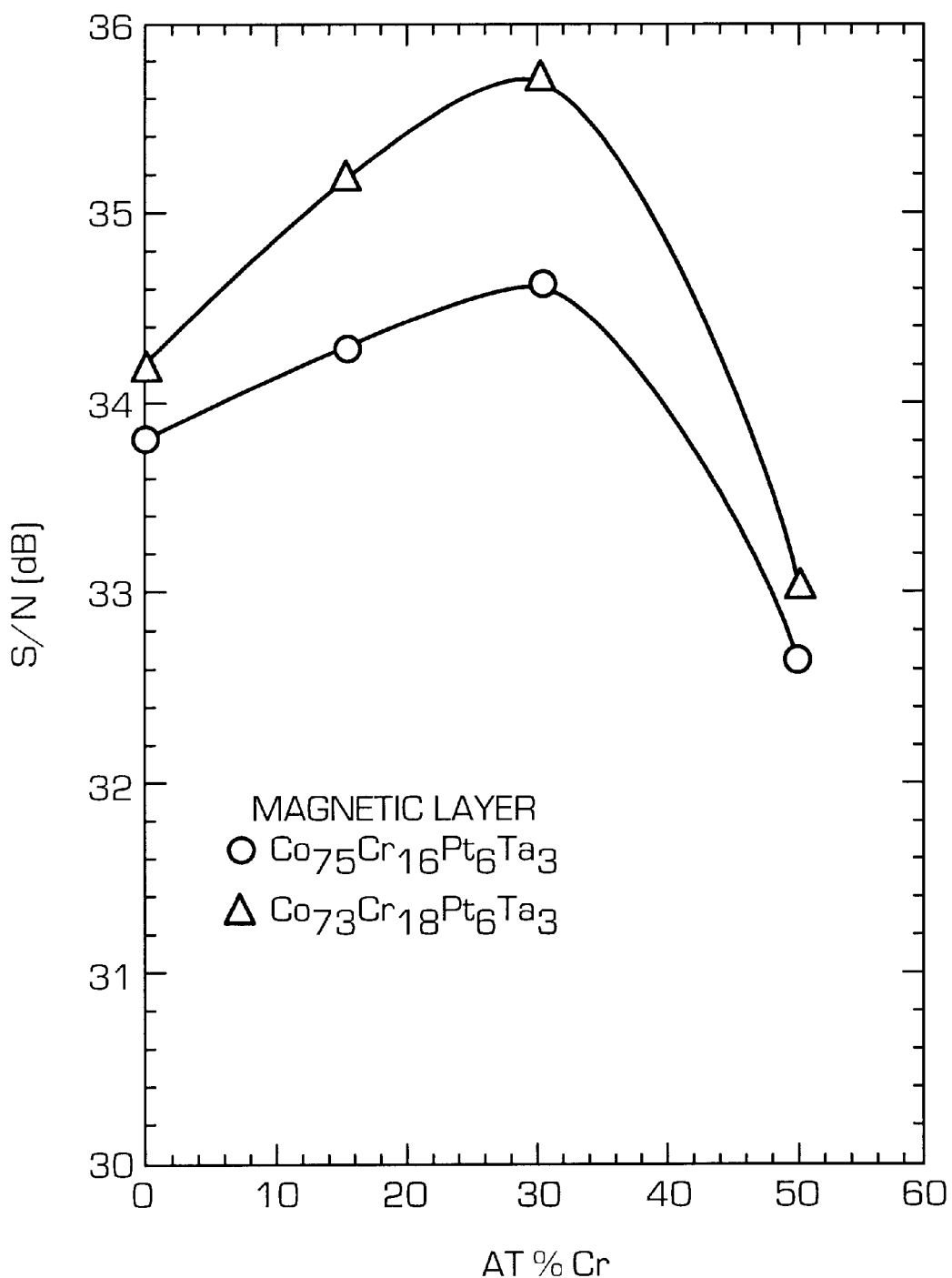
FIG. 1 is a graph showing S/N ratio as a function of Cr content (at %) for a magnetic recording medium having a $(Ni_{50}Al)_{100-X}Cr_X$ alloy underlayer.

The mechanism which provides the improved magnetic characteristics of the present invention is not clearly understood. However, it is considered that the lattice constant expands by adding to an NiAl underlayer a third element such as Cr to better match the magnetic layer. As a result, the magnetic characteristics are improved. The lattice constants of various compositions are shown in the following Examples. Furthermore, although the lattice constant of an $Ni_{50}Al$ alloy is 2.887 Å, it is 2.890 Å or more in alloys having added thereto a third element such as Cr. Thus, for better matching, the lattice constant is preferably from 2.91 to 3.03 Å.

In the present invention, on the underlayer comprising a $(Ni_{50}Al)_{100-X}M_X$ alloy (first underlayer), a second underlayer comprising Cr or a Cr alloy comprising Cr and one or more of Ti, Mo, Al, Ta, W, Ni, B, Si and V depending on the intended application is preferably laminated thereon in order to further improve the properties of the inventive magnetic recording medium. When the second underlayer comprises a Cr alloy, the Cr content is preferably at least 50 at %.

The non-magnetic substrate for use in the present invention includes an Al alloy having formed thereon a NiP plating film (hereinafter referred to as a "NiP plated Al substrate") commonly used as a substrate for magnetic recording media, a glass substrate which can provide excellent surface smoothness and a silicon substrate. In a recording medium for a MR head, as the recording density increases, the flying height of the head must be lowered. Accordingly, a smooth substrate surface is preferred. More specifically, the non-magnetic substrate for use in the present invention preferably has an average surface roughness Ra of 20 Å or less.

The magnetic layer of the present invention may comprise conventionally known Co alloy films such as a Co—Cr—Ta alloy, a Co—Cr—Pt alloy, a Co—Cr—Pt—Ta alloy and a Co—Cr—Ni alloy. However, in order to best provide the effects of the non-magnetic underlayer of the present invention, the use of a Co—Cr—Pt—Ta alloy is preferred.

The Co—Cr—Pt—Ta alloy represented by the compositional formula $Co_{(100-X-Y-Z)}Cr_XPt_YTa_Z$ preferably has a composition of 13 at % $\leq X \leq 24$ at %, 1 at % $\leq Y \leq 12$ at % and 2 at % $\leq Z \leq 7$ at %. The Cr content is from 13 to 24 at % because if it is less than 13 at %, the dispersion of Co particles due to segregation of Cr is insufficient, whereas if the Co content exceeds 20 at %, the coercivity Hc is noticeably reduced and the medium tends to be unsuitable as a MR head medium. The Pt content is from 1 to 12 at % because if it is less than 1 at %, high coercivity Hc cannot be obtained, whereas if it exceeds 12 at %, noise tends to increase. The Ta content is from 2 to 7 at % because if it is less than 2 at %, noise tends to increase, whereas if it exceeds 7 at %, high coercivity Hc is difficult to obtain.

The first underlayer of the present invention preferably has a thickness of from 25 to 1,500 Å. The first underlayer may have any thickness as long as it falls within this range, however, the first underlayer more preferably has a thickness of from 400 to 1,000 Å.

The second underlayer of the present invention preferably has a thickness of from 1 to 1,000 Å. The second underlayer may have any thickness as long as it falls within this range, however, the second underlayer more preferably has a thickness of from 50 to 200 Å.

The thickness of the Co alloy magnetic layer is not particularly limited. However, in the case of a magnetic recording medium for a MR head, the thickness is preferably adjusted to have a remanent magnetization layer thickness product BrT of from 50 to 130 G$\mu$m. If the remanent magnetization layer thickness product BrT is less than 50 G$\mu$m, proper output is difficult to attain, whereas if it exceeds 130 G$\mu$m, properties suitable for a MR head medium are difficult to obtain.

The magnetic recording medium of the present invention can be produced by a conventionally known method. However, the first underlayer comprising or consisting essentially of a $(Ni_{50}Al)_{100-X}M_X$ alloy may be obtained by sputtering an alloy target, and preferably a sintered alloy target having the composition $(Ni_{50}Al)_{100-X}M_X$ (where M is one or more of Cr (X=1–40 at %), Mo (X=1–50 at %), W (X=1–60 at %), V (X=1–35 at %), Zr (X=1–25 at %), Nb (X=1–35 at %) and Pd (X=1–25 at %)) prepared according to the ingot method. The sintered alloy target may be produced by a conventionally known sintering method such as a HIP (hot isostatic press) method or hot press method, using an alloy powder having the final target composition, or using a plurality of alloy powders or a single metal powder capable of yielding the final target composition. Alloy powders and metal powders can also be produced by a conventionally known method such as the gas atomizing method.

The present invention is described below by reference to the following Examples, however, the present invention should not be construed as being limited thereto.

EXAMPLES

Figure 8:
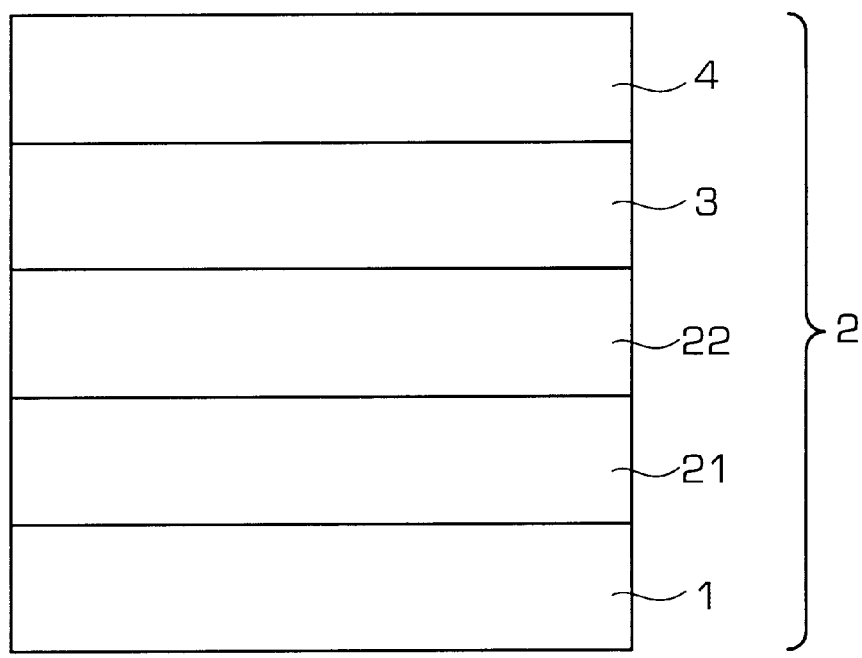
FIG. 8 shows a schematic cross section of the magnetic recording medium according to one embodiment of the present invention.

A NiP plated Al substrate was textured to have a surface roughness Ra of 25 Å and set in a DC magnetron sputtering apparatus. After evacuating to $2 \times 10^{-7}$ Torr, an alloy film shown in Tables 1 and 2 as a first underlayer was formed on the substrate to a thickness of 700 Å, and then a Cr film as a second underlayer was formed on the first underlayer to a thickness of 200 Å. The first underlayer was formed using a sintered target produced by a HIP technique having the composition of the desired alloy film. Subsequently, a $Co_{75}Cr_{16}Pt_6Ta_3$ (at %) alloy magnetic layer or a $Co_{73}Cr_{18}Pt_6Ta_3$ (at %) alloy magnetic layer was formed thereon. Furthermore, a carbon film as a protective layer was formed on the magnetic layer to a thickness of 100 Å. The Ar pressure was 3 mTorr during each of the film forming steps. The layer thickness of the magnetic layer was 145 G$\mu$m in terms of its remanent magnetization layer thickness product (BrT). The structure of the magnetic recording medium thus obtained is schematically shown in FIG. 8. In FIG. 8, 1 is a non-magnetic substrate (NiP plated Al substrate), 2 is a non-magnetic underlayer comprising a first underlayer 21 and a second underlayer 22, 3 is a magnetic layer and 4 is a protective layer.

The magnetic properties of the magnetic recording media thus prepared were measured using a vibrating sample magnetometry (VSM) technique. The recording/reproducing properties were evaluated by obtaining a ratio of the recording/reproducing output to noise (S/N) using a composite thin film magnetic head having a magnetic resistant (MR) element in reproduction, at a linear recording density of 206.8 kFCI. As shown in Tables 1 and 2, S*(%) is the measured coercive squareness. The lattice constants of some of the first underlayers were measured by X-ray crystal structure diffraction. The results are shown in Table 1 ($Co_{75}Cr_{16}Pt_6Ta_3$ (at %) alloy magnetic layer) and in Table 2 ($Co_{73}Cr_{18}Pt_6Ta_3$ (at %) alloy magnetic layer). The S/N ratio as a function of M (both content and type of element) in the $(Ni_{50}Al)_{100-x}M_x$ first underlayer is shown in FIGS. 1 to 7.

TABLE 1

| No. | Composition of First Underlayer | Hc (Oe) | S* (%) | S/N (dB) | Lattice Constant (Å) |
|---|---|---|---|---|---|
| Example 1 | $(Ni_{50}Al)_{15}Cr$ | 2749 | 88.6 | 34.31 | 2.977 |
| Example 2 | $(Ni_{50}Al)_{30}Cr$ | 2693 | 92.3 | 34.67 | |
| Example 3 | $(Ni_{50}Al)_5Mo$ | 3037 | 81.4 | 34.74 | |

TABLE 1-continued

| No. | Composition of First Underlayer | Hc (Oe) | S* (%) | S/N (dB) | Lattice Constant (Å) |
|---|---|---|---|---|---|
| Example 4 | $(Ni_{50}Al)_{10}Mo$ | 2908 | 85.9 | 34.65 | |
| Example 5 | $(Ni_{50}Al)_{20}Mo$ | 2891 | 82.1 | 34.50 | 2.958 |
| Example 6 | $(Ni_{50}Al)_{33}Mo$ | 2783 | 72.6 | 34.20 | |
| Example 7 | $(Ni_{50}Al)_{25}W$ | 2779 | 84.7 | 34.47 | |
| Example 8 | $(Ni_{50}Al)_{35}W$ | 2731 | 83.8 | 35.01 | 3.006 |
| Example 9 | $(Ni_{50}Al)_{45}W$ | 2795 | 80.0 | 34.80 | |
| Example 10 | $(Ni_{50}Al)_5V$ | 2734 | 90.2 | 34.55 | 2.894 |
| Example 11 | $(Ni_{50}Al)_{10}V$ | 2719 | 91.3 | 34.32 | |
| Example 12 | $(Ni_{50}Al)_{15}V$ | 2697 | 91.7 | 34.26 | |
| Example 13 | $(Ni_{50}Al)_5Zr$ | 2845 | 88.9 | 34.63 | |
| Example 14 | $(Ni_{50}Al)_{10}Zr$ | 2758 | 90.9 | 34.72 | 2.914 |
| Example 15 | $(Ni_{50}Al)_5Nb$ | 2875 | 87.0 | 34.34 | |
| Example 16 | $(Ni_{50}Al)_{10}Nb$ | 2882 | 86.6 | 34.55 | 2.919 |
| Example 17 | $(Ni_{50}Al)_{15}Pd$ | 2916 | 78.6 | 34.52 | 3.013 |
| Comparative Example 1 | $(Ni_{50}Al)$ | 2669 | 89.9 | 33.08 | 2.887 |
| Comparative Example 2 | Cr | 2496 | 80.8 | 32.39 | |
| Comparative Example 3 | $(Ni_{50}Al)_{50}Cr$ | 1977 | 87.8 | 32.69 | |
| Comparative Example 4 | $(Ni_{50}Al)_{70}Mo$ | 1534 | 65.8 | 33.57 | |
| Comparative Example 5 | $(Ni_{50}Al)_{70}W$ | 2401 | 82.7 | 32.31 | |
| Comparative Example 6 | $(Ni_{50}Al)_{50}V$ | 1759 | 80.1 | 33.07 | |
| Comparative Example 7 | $(Ni_{50}Al)_{40}Zr$ | 2033 | 73.7 | 32.18 | |
| Comparative Example 8 | $(Ni_{50}Al)_{50}Nb$ | 1628 | 75.2 | 32.84 | |
| Comparative Example 9 | $(Ni_{50}Al)_{35}Pd$ | 1762 | 55.9 | 32.73 | |

*magnetic alloy layer: $Co_{75}Cr_{16}Pt_6Ta_3$

TABLE 2

| No. | Composition of First Underlayer | Hc (Oe) | S* (%) | S/N (dB) | Lattice Constant (Å) |
|---|---|---|---|---|---|
| Example 18 | $(Ni_{50}Al)_{15}Cr$ | 2597 | 73.1 | 35.22 | 2.977 |
| Example 19 | $(Ni_{50}Al)_{30}Cr$ | 2557 | 82.4 | 34.36 | |
| Example 20 | $(Ni_{50}Al)_5Mo$ | 2546 | 88.0 | 34.74 | |
| Example 21 | $(Ni_{50}Al)_{10}Mo$ | 2556 | 81.9 | 34.42 | |
| Example 22 | $(Ni_{50}Al)_{20}Mo$ | 2571 | 82.1 | 34.33 | 2.958 |
| Example 23 | $(Ni_{50}Al)_{33}Mo$ | 2658 | 70.9 | 34.25 | |
| Example 24 | $(Ni_{50}Al)_{25}W$ | 2588 | 77.4 | 34.99 | |
| Example 25 | $(Ni_{50}Al)_{35}W$ | 2587 | 75.7 | 35.03 | 3.006 |
| Example 26 | $(Ni_{50}Al)_{45}W$ | 2579 | 73.1 | 34.89 | |
| Example 27 | $(Ni_{50}Al)_5V$ | 2580 | 82.4 | 34.76 | 2.894 |
| Example 28 | $(Ni_{50}Al)_{10}V$ | 2551 | 82.2 | 34.98 | |
| Example 29 | $(Ni_{50}Al)_{15}V$ | 2604 | 81.2 | 35.14 | |
| Example 30 | $(Ni_{50}Al)_5Zr$ | 2982 | 76.4 | 35.11 | |
| Example 31 | $(Ni_{50}Al)_{10}Zr$ | 2901 | 77.6 | 35.28 | 2.914 |
| Example 32 | $(Ni_{50}Al)_5Nb$ | 2793 | 77.7 | 35.23 | |
| Example 33 | $(Ni_{50}Al)_{10}Nb$ | 2803 | 76.5 | 35.33 | 2.919 |
| Example 34 | $(Ni_{50}Al)_{15}Pd$ | 2602 | 75.2 | 34.97 | 3.013 |
| Comparative Example 10 | $Ni_{50}Al$ | 2504 | 84.4 | 34.08 | 2.887 |
| Comparative Example 11 | Cr | 2326 | 81.7 | 32.57 | |
| Comparative Example 12 | $(Ni_{50}Al)_{50}Cr$ | 2016 | 86.9 | 33.07 | |
| Comparative Example 13 | $(Ni_{50}Al)_{70}Mo$ | 1642 | 63.8 | 33.72 | |
| Comparative Example 14 | $(Ni_{50}Al)_{70}W$ | 2126 | 71.9 | 33.47 | |
| Comparative Example 15 | $(Ni_{50}Al)_{50}V$ | 1970 | 72.1 | 33.15 | |
| Comparative Example 16 | $(Ni_{50}Al)_{40}Zr$ | 1849 | 78.8 | 32.96 | |

TABLE 2-continued

| No. | Composition of First Underlayer | Hc (Oe) | S* (%) | S/N (dB) | Lattice Constant (Å) |
|---|---|---|---|---|---|
| Comparative Example 17 | $(Ni_{50}Al)_{50}Nb$ | 1783 | 68.5 | 33.47 | |
| Comparative Example 18 | $(Ni_{50}Al)_{35}Pd$ | 1457 | 51.5 | 33.15 | |

*magnetic alloy layer: $Co_{73}Cr_{18}Pt_6Ta_3$

It is seen from Table 1 (where a $Co_{75}Cr_{16}Pt_6Ta_3$ (at %) alloy magnetic layer was used) that in Comparative Example 1 using $Ni_{50}Al$ (at %) as the first underlayer, the coercive force (Hc) was 2669 Oe, whereas in Examples 1 to 17 of the present invention, the coercive force (Hc) was 2,690 Oe or more. The S/N ratio was 33.08 dB in Comparative Example 1, but was remarkably 34.20 dB or more in Examples 1 to 17 of the present invention. The lattice constant was 2.887 Å in Comparative Example 1, and in all of the measured Examples of the present invention the lattice constant was larger than the value of Comparative Example 1.

Furthermore, it is seen from Table 2 (where a $Co_{73}Cr_{18}Pt_6Ta_3$ (at %) alloy magnetic layer was used) that in Comparative Example 10 using $Ni_{50}Al$ (at %) as the first layer, the coercive force (Hc) was 2,504 Oe, whereas in Examples 18 to 34 of the present invention, the coercive force (Hc) was 2,546 Oe or more. In Comparative Example 10, the S/N ratio was 34.08 dB, but was 34.25 dB or more in Examples 18 to 34 of the present invention. The comparison between Tables 1 and 2 shows that the effects of the invention are enchanced with the use of a $Co_{73}Cr_{18}Pt_6Ta3$ (at %) alloy magnetic layer.

FIG. 1 is a graph showing S/N as a function of Cr content in a $(Ni_{50}Al)_{100-x}Cr_x$ alloy underlayer. From FIG. 1, when the Cr content exceeds 40 at %, the S/N ratio is lower than that of the Cr-free alloy. Furthermore, the Cr content is preferably from 10 to 35 at %, more preferably from 15 to 35 at %.

Figure 2:
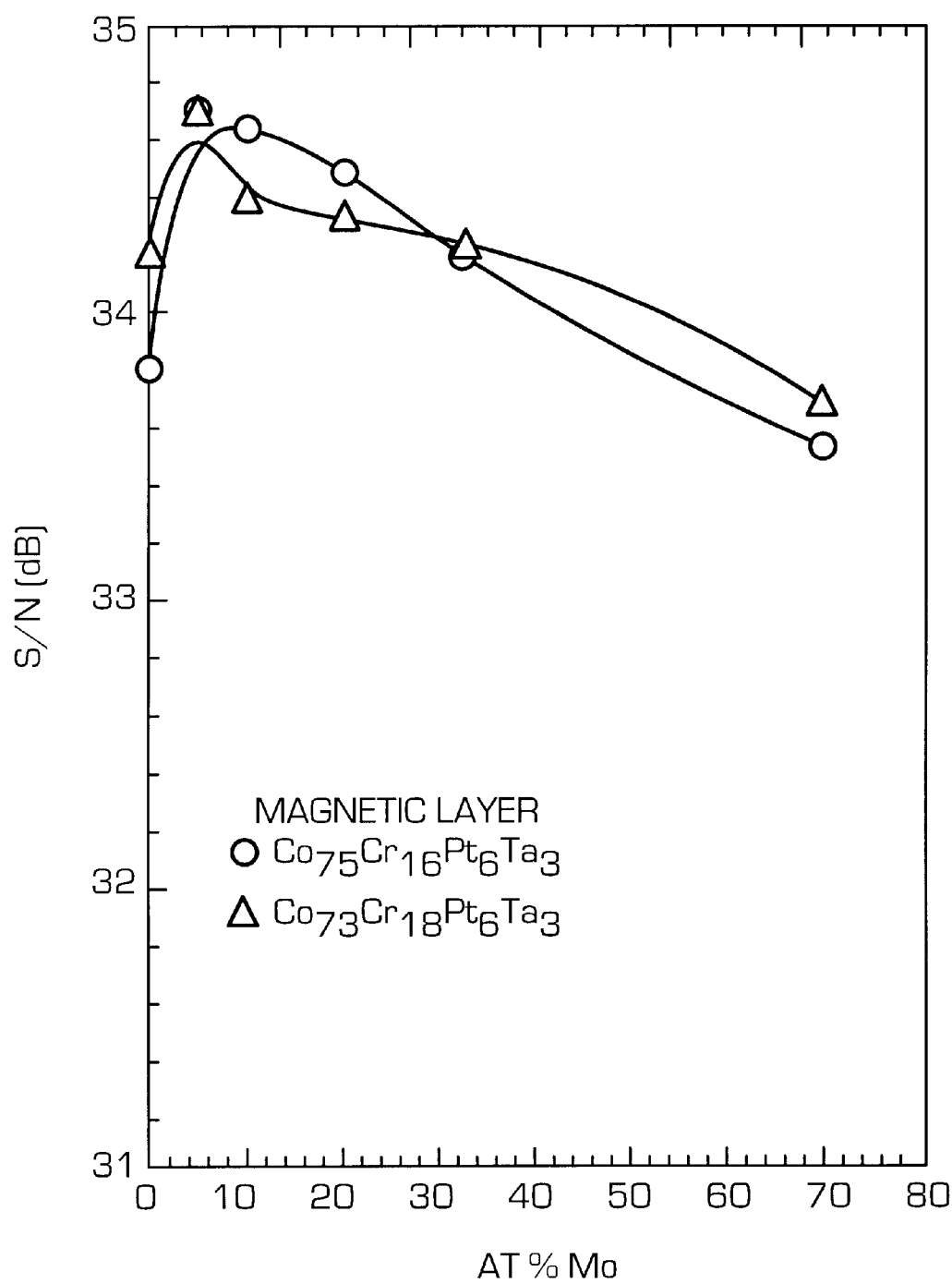
FIG. 2 is a graph showing S/N ratio as a function of Mo content (at %) for a magnetic recording medium having a $(Ni_{50}Al)_{100-X}Mo_X$ alloy underlayer.

FIG. 2 is a graph showing S/N as a function of Mo content in a $(Ni_{50}Al)_{100-x}Mo_x$ alloy underlayer. From FIG. 2, when the Mo content exceeds 50 at %, the S/N ratio is lower than that of the Mo-free alloy. Furthermore, the Mo content is preferably from 3 to 40 at %, more preferably from 5 to 30 at %.

Figure 3:
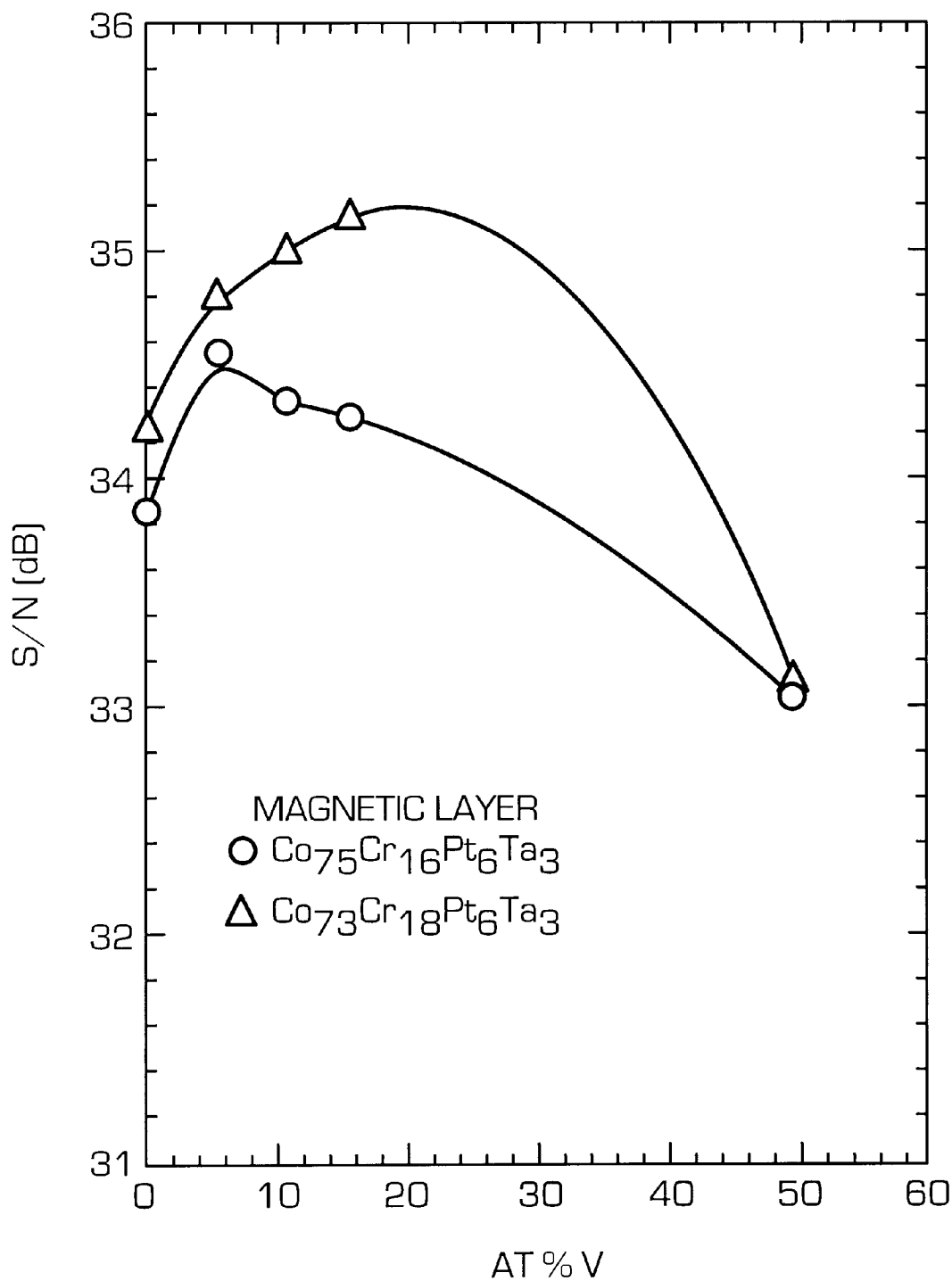
FIG. 3 is a graph showing S/N ratio as a function of V content (at %) for a magnetic recording medium having a $(Ni_{50}Al)_{100-X}V_X$ alloy underlayer.

FIG. 3 is a graph showing S/N as a function of V content in a $(Ni_{50}Al)_{100-x}V_x$ alloy underlayer. From FIG. 3, when the V content exceeds 35 at %, the S/N ratio is lower than that of the V-free alloy. Furthermore, the V content is preferably from 3 to 30 at %, more preferably from 5 to 20 at %.

Figure 4:
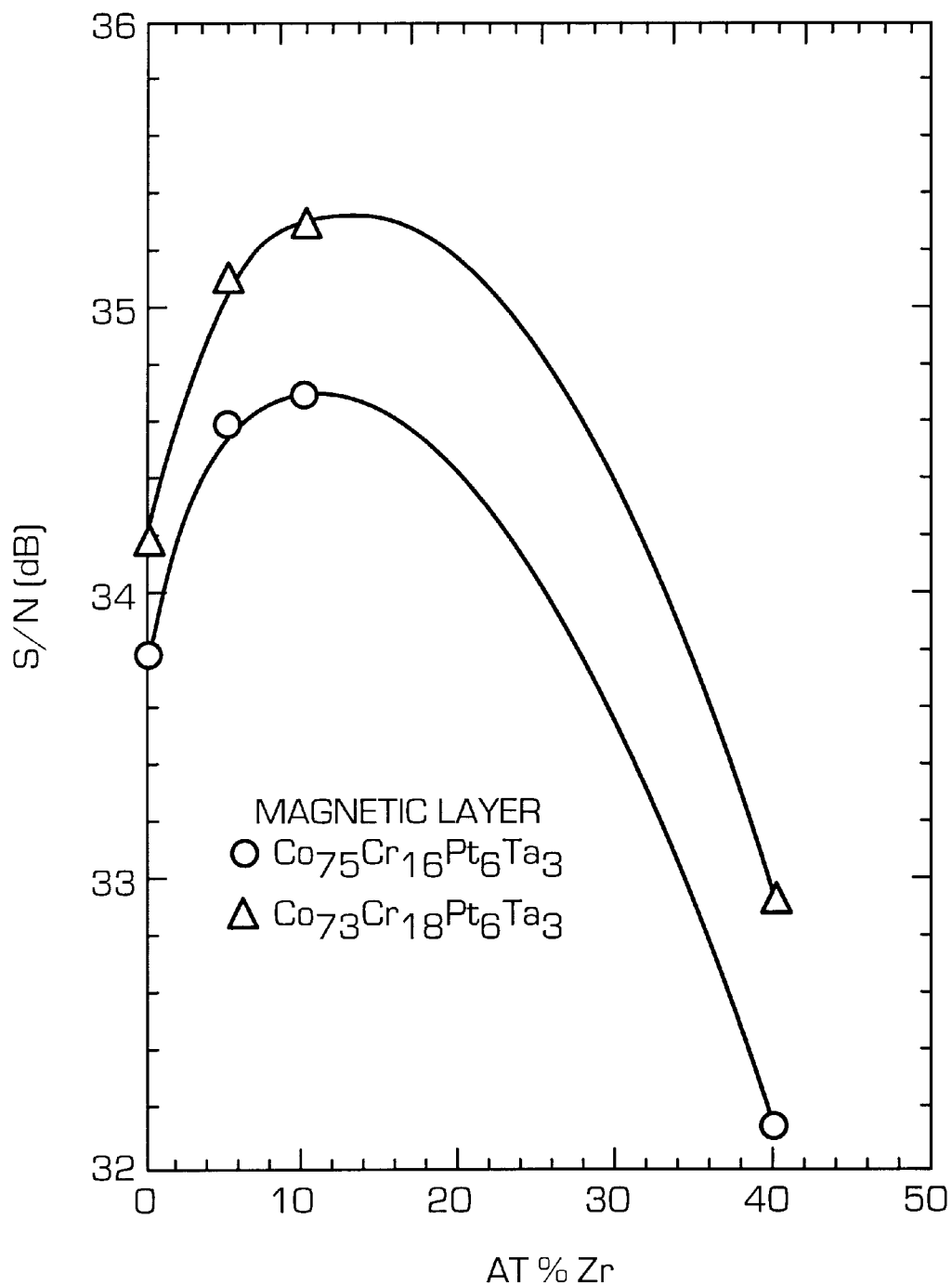
FIG. 4 is a graph showing S/N ratio as a function of Zr content (at %) for a magnetic recording medium having a $(Ni_{50}Al)_{100-X}Zr_X$ alloy underlayer.

FIG. 4 is a graph showing S/N as a function of Zr content in a $(Ni_{50}Al)_{100-x}Zr_x$ alloy underlayer. From FIG. 4, when the Zr content exceeds 25 at %, the S/N ratio is lower than that of the Zr-free alloy. Furthermore, the Cr content is preferably from 5 to 20 at %, more preferably from 5 to 15 at %.

Figure 5:
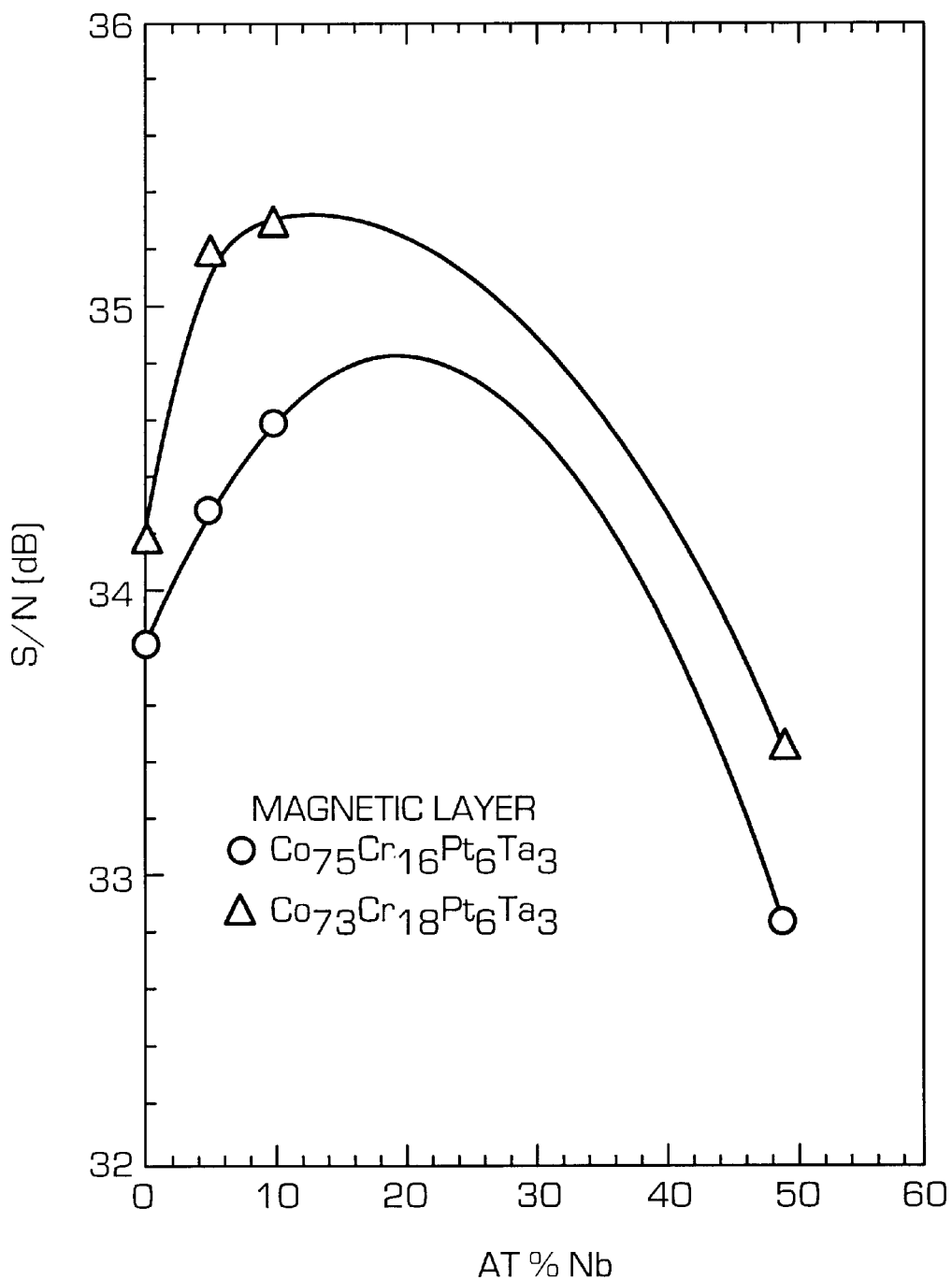
FIG. 5 is a graph showing S/N ratio as a function of Nb content (at %) for a magnetic recording medium having a $(Ni_{50}Al)_{100-X}Nb_X$ alloy underlayer.

FIG. 5 is a graph showing S/N as a function of Nb content in a $(Ni_{50}Al)_{100-x}Nb_x$ alloy underlayer. From FIG. 5, when the Nb content exceeds 35 at %, the S/N ratio is lower than that of the Nb-free alloy. Furthermore, the Cr content is preferably from 5 to 20 at %, more preferably from 5 to 15 at %.

Figure 6:
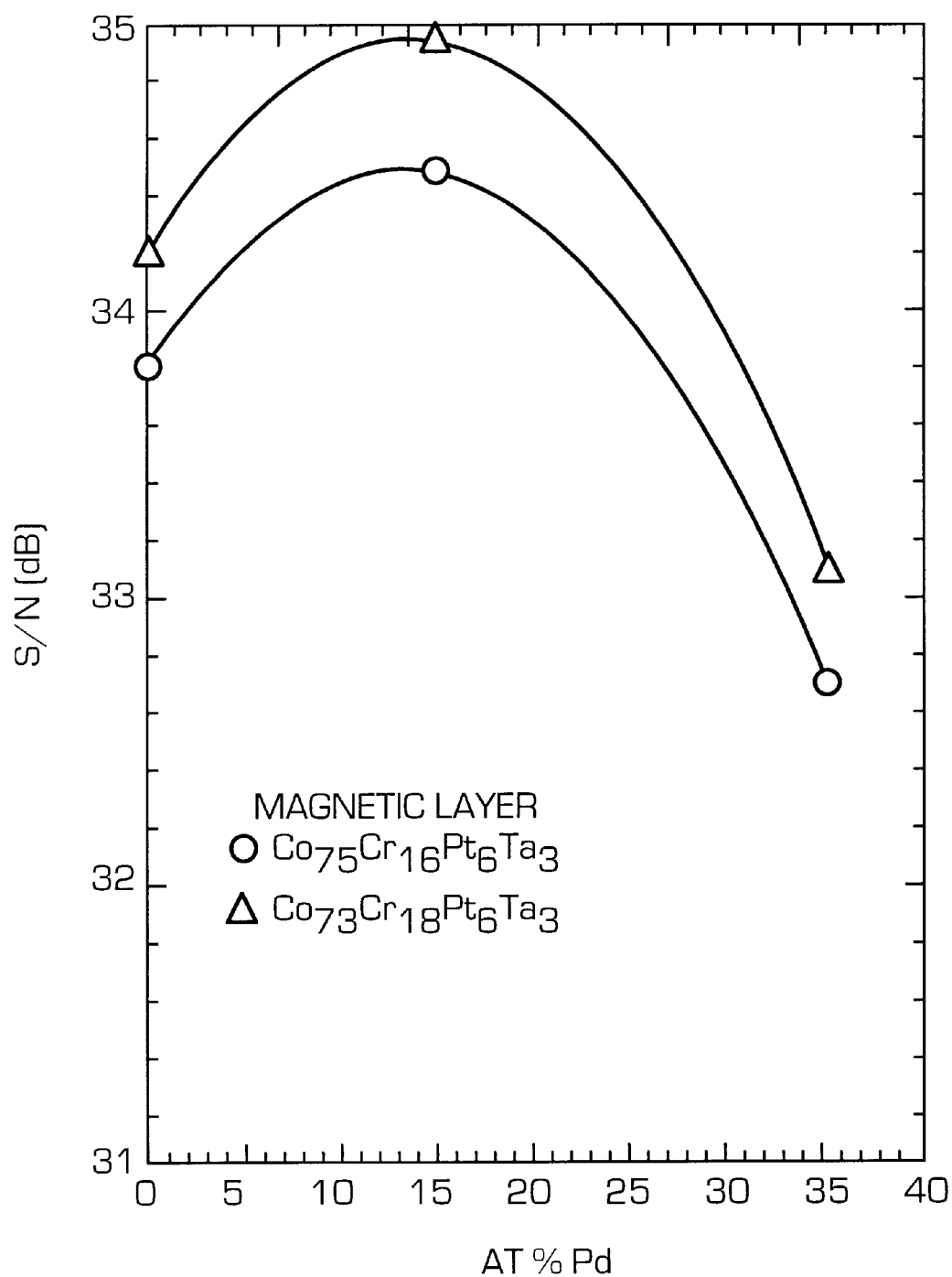
FIG. 6 is a graph showing S/N ratio as a function of Pd content (at %) for a magnetic recording medium having a $(Ni_{50}Al)_{100-X}Pd_X$ alloy underlayer.

FIG. 6 is a graph showing S/N as a function of Pd content in a $(Ni_{50}Al)_{100-x}Pd_x$ alloy underlayer. From FIG. 6, when the Pd content exceeds 25 at %, the S/N ratio is lower than that of the Pd-free alloy. Furthermore, the Pd content is preferably from 5 to 20 at %, more preferably from 10 to 20 at %.

Figure 7:
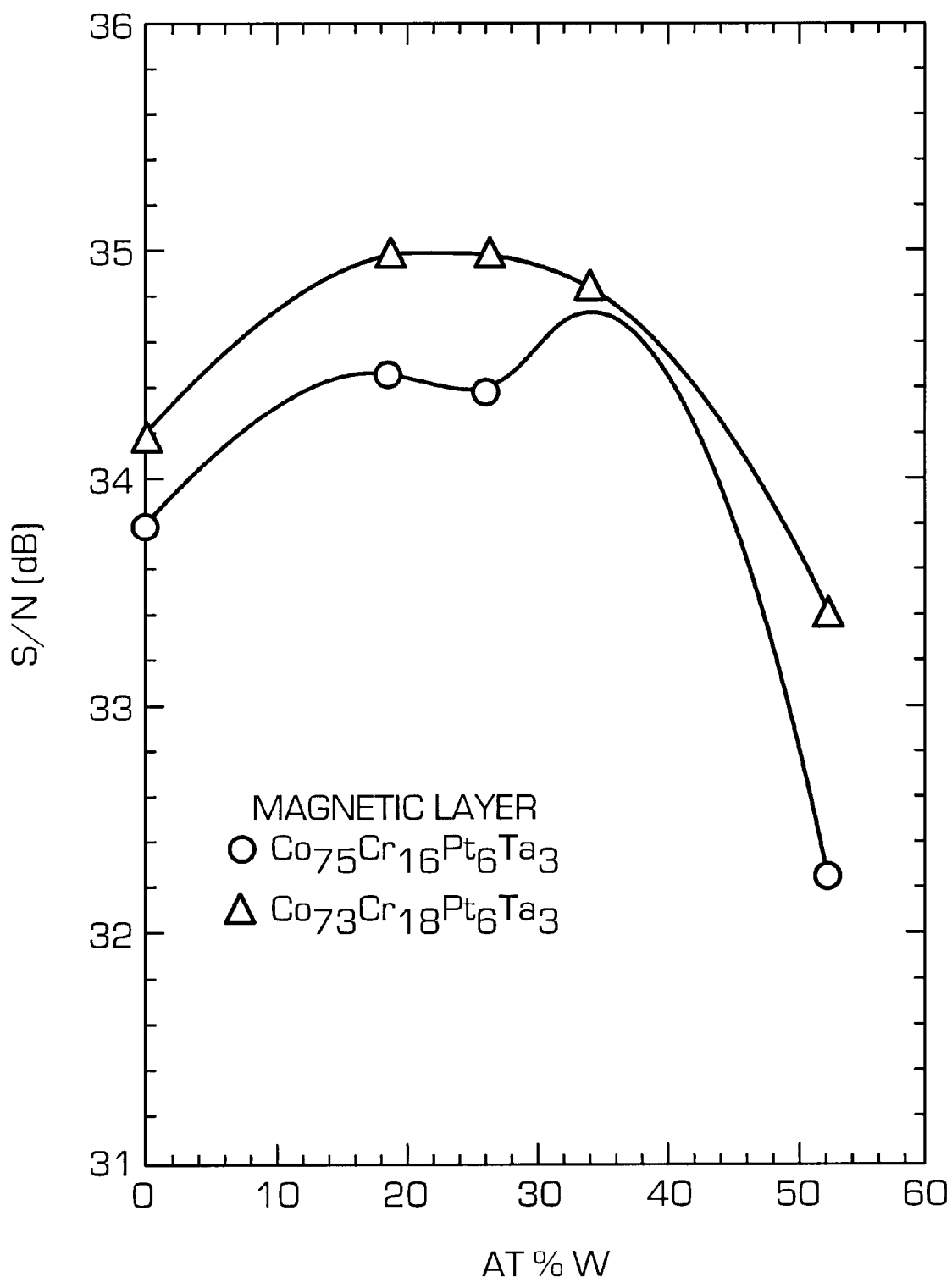
FIG. 7 is a graph showing S/N ratio as a function of W content (at %) for a magnetic recording medium having a $(Ni_{50}Al)_{100-X}W_X$ alloy underlayer.

FIG. 7 is a graph showing S/N as a function of W content in a $(Ni_{50}Al)_{100-x}W_x$ alloy underlayer. From FIG. 7, when the W content exceeds 60 at %, the S/N ratio is lower than that of the W-free alloy. Furthermore, the W content is preferably from 20 to 50 at %, more preferably from 25 to 40 at %.

As described above, the magnetic recording medium of the present invention can achieve high output without increasing the medium noise, and is well adapted as a high-density magnetic recording medium for use with a MR head.

While the invention has been described in detail and with reference to specific embodiments thereof, it will be apparent to one skilled in the art that various changes and modifications can be made therein without departing from the spirit and scope thereof.

What is claimed is:

1. A magnetic recording medium comprising a non-magnetic substrate having thereon a first non-magnetic underlayer and a magnetic layer comprising a Co alloy provided on the non-magnetic underlayer, wherein said non-magnetic underlayer comprises an alloy represented by the formula: $(Ni_{50}Al)_{100-x}M_x$, wherein M is one of Cr (X=1–40 at %), Mo (X=1–50 at %), W (X=1–60 at %), V (X=1–35 at %), Zr (X=1–25 at %), Nb (X=1–35 at %) and Pd (X=1–25 at %), and wherein M also includes two or more of Cr, Mo, W, V, Zr, Nb and Pd, when X is from 1 to 60 at %.

2. The magnetic recording medium as claimed in claim 1, further comprising a second underlayer comprising Cr or a Cr alloy comprising Cr and one or more of Ti, Mo, Al, Ta, W, Ni, B, Si and V provided between said first underlayer and said magnetic layer.

3. The magnetic recording medium as claimed in claim 1, wherein the $(Ni_{50}Al)_{100-x}M_x$ alloy of said first underlayer has a lattice constant of 2.88 Å or more.

4. The magnetic recording medium as claimed in claim 2, wherein the $(Ni_{50}Al)_{100-x}M_x$ alloy of said first underlayer has a lattice constant of 2.88 Å or more.

5. The magnetic recording medium as claimed in claim 1, wherein the $(Ni_{50}Al)_{100-x}M_x$ alloy of said first underlayer has a lattice constant of from 2.91 to 3.03 Å.

6. The magnetic recording medium as claimed in claim 2, wherein the $(Ni_{50}Al)_{100-x}M_x$ alloy of said first underlayer has a lattice constant of from 2.91 to 3.03 Å.

7. The magnetic recording medium as claimed in claim 1, wherein said non-magnetic substrate is selected from the group consisting of an Al substrate plated with NiP, a glass substrate and a silicon substrate.

8. The magnetic recording medium as claimed in claim 2, wherein said non-magnetic substrate is selected from the group consisting of an Al substrate plated with NiP, a glass substrate and a silicon substrate.

9. The magnetic recording medium as claimed in claim 1, wherein said magnetic layer comprises a CoCrPtTa alloy.

10. The magnetic recording medium as claimed in claim 2, wherein said magnetic layer comprises a CoCrPtTa alloy.

11. The magnetic recording medium as claimed in claim 2, wherein said second underlayer is laminated on said first underlayer.

12. The magnetic recording medium as claimed in claim 1, wherein X in the formula $(Ni_{50}Al)_{100-X}M_X$ is from 1 to 50 at % when M comprises two or more of Cr, Mo, W, V, Zr, Nb and Pd.

13. The magnetic recording medium as claimed in claim 1, further comprising a protective layer provided on said magnetic layer.

14. The magnetic recording medium as claimed in claim 1, wherein the magnetic layer comprises a $Co_{(100-X-Y-Z)}Cr_XPt_YTa_Z$ alloy wherein 13 at % $\leq X \leq 24$ at %, 1 at % $\leq Y \leq 12$ at % and 2 at % $\leq Z \leq 7$ at %.

15. The magnetic recording medium as claimed in claim 1, wherein said first underlayer has a thickness of from 25 to 1,500 Å.

16. A non-magnetic alloy film having a composition of $(Ni_{50}Al)_{100-X}M_X$, wherein is one of Cr (X=1–40 at %), Mo (X=1–50 at %), W (X=1–60 at %), V (X=1–35 at %), Zr (X=1–25 at %), Nb (X=1–35 at %) and Pd (X=1–25 at %), and wherein M also comprises two or more of Cr, Mo, W, V, Zr, Nb and Pd, when X is from 1 to 60 at %.

17. A sputtering target comprising a sintered alloy having a composition of $(Ni_{50}Al)_{100-X}M_X$, wherein M is one of Cr (X=1–40 at %), Mo (X=1–50 at %), W (X=1–60 at %), V (X=1–35 at %), Zr (X=1–25 at %), Nb (X=1–35 at %) and Pd (X=1–25 at %), and wherein M also comprises two or more of Cr, Mo, W, V, Zr, Nb and Pd, when X is from 1 to 60 at %.

\* \* \* \* \*